(12) United States Patent
Morris et al.

(10) Patent No.: US 9,025,399 B1
(45) Date of Patent: May 5, 2015

(54) METHOD FOR TRAINING A CONTROL SIGNAL BASED ON A STROBE SIGNAL IN A MEMORY MODULE

(71) Applicant: Intel Corporation, Santa Clara, CA (US)

(72) Inventors: Tonia G. Morris, Irmo, SC (US); Jonathan C. Jasper, San Jose, CA (US); John V. Lovelace, Irmo, SC (US); Benjamin T. Tyson, Columbia, SC (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 14/099,315

(22) Filed: Dec. 6, 2013

(51) Int. Cl.
*G11C 7/22* (2006.01)

(52) U.S. Cl.
CPC .......................................... *G11C 7/22* (2013.01)

(58) Field of Classification Search
CPC ...... G11C 7/1066; G11C 7/1051; G11C 7/22; G11C 7/222
USPC .......................... 365/193, 191, 233.1, 233.12
See application file for complete search history.

(56) References Cited

U.S. PATENT DOCUMENTS

| | | | |
|---|---|---|---|
| 7,209,396 B2 * | 4/2007 | Schnell .......................... | 365/193 |
| 8,009,490 B2 | 8/2011 | Chae | |
| 8,320,204 B2 * | 11/2012 | Nakashima .................... | 365/193 |
| 8,533,538 B2 | 9/2013 | Chaudhuri et al. | |
| 8,824,224 B2 * | 9/2014 | Ware et al. ..................... | 365/193 |
| 2001/0046163 A1 * | 11/2001 | Yanagawa ..................... | 365/194 |
| 2005/0248375 A1 | 11/2005 | Jung | |
| 2008/0112235 A1 | 5/2008 | Hein et al. | |
| 2009/0168564 A1 | 7/2009 | Lee et al. | |
| 2011/0320867 A1 | 12/2011 | Chaudhuri et al. | |
| 2012/0170389 A1 | 7/2012 | Kizer et al. | |

FOREIGN PATENT DOCUMENTS

KR   10-2009-0118603   11/2009

OTHER PUBLICATIONS

JEDEC Solid State Technology Association, "DDR4 SDRAM", JEDEC Standard, JESD79-4, Sep. 2012, 214 pp.
International Search Report and Written Opinion for International Application No. PCT/US2014/068924, dated Feb. 25, 2015, 11 pp.
US Patent No. 8,009,490, Dated Aug. 30, 2011, is an English Language Equivalent of KR1020090118603, dated Nov. 18, 2009.

* cited by examiner

*Primary Examiner* — Tan T. Nguyen (74) *Attorney, Agent, or Firm* — Konrad Raynes Davda & Victor LLP; Rabindranath Dutta (57) ABSTRACT

A memory controller transmits a control signal to a memory module, where the memory controller continuously transmits a clock signal to the memory module. The memory controller determines adjustments to the control signal with respect to the clock signal, by iteratively analyzing a strobe signal.

25 Claims, 6 Drawing Sheets

METHOD FOR TRAINING A CONTROL SIGNAL BASED ON A STROBE SIGNAL IN A MEMORY MODULE

BACKGROUND

The personal computer and server industries may require performance gains across many workload types in order to be competitive. Various mechanisms are used to provide these levels of performance gains including, for example, core count increases and memory size/bandwidth/latency improvements. Memory improvements may take the form of faster Dynamic Random Access Memory (DRAM), higher Double Data Rate (DDR) bus frequencies, larger capacity Dual Inline Memory Modules (DIMMs), more DIMMs per channel and other optimizations. There are many DDR standards defined by the JEDEC Solid State Technology Association, such as, the Double Data Rate Fourth Generation (DDR4) Synchronous Random Access Memory (SDRAM) standard JESD79-4, published September 2012.

Higher DDR speeds require that DRAM channels be carefully tuned for optimum signal quality and DDR bus timing. This tuning is performed by the basic input/output system (BIOS) during boot up and is commonly referred to as "DDR training." DDR training" includes many time consuming steps, for example, centering of various strobe signals, cross talk elimination and reference voltage calibration. These calibration steps are used to derive optimal DDR timing parameters that are applied to the DRAM controller and DIMMs. This programming is done before memory is accessed as these parameters cannot be updated during operation without disturbing memory traffic.

Non-optimum parameters result in higher bit error rates and generally destabilize system operation. These complex calibration steps result in increased boot time. Certain DDR proposals call for per DDR device calibration across multiple parameters to achieve higher speeds and lower voltages. As a result, memory training processes in these platforms may be increased.

In a typical memory system of a computer system, a memory controller facilitates the access of a memory module in the computer system. The memory module may include one or more memories. These one or more memories are also called ranks. The memory controller transmits a host of signals to the ranks including address signals, control signals, clock signals, etc., to access data from the ranks or to send data to the ranks. To send and receive correct data to and from the ranks, the memory controller trains (modifies) various signals with respect to a clock signal.

Typically, the memory controller may train a signal by transmitting a particular signal with respect to a clock signal to the ranks and then analyzing a response from each rank to ascertain if the rank correctly received the particular signal. Upon a correct response from the rank, the memory controller delays the phase of the particular signal with respect to the clock signal and then re-transmits the delayed particular signal with a delayed phase to the rank. The memory controller then analyzes a response from the rank to ascertain if the rank correctly received the delayed particular signal. If no response (or an incorrect response) is received from the rank to the memory controller, the memory module transitions to an unknown state.

Current DDR interfaces are achieving higher frequencies, and board routing flight times are not scaling with these frequencies, where board routing time is the time it takes for a signal to propagate along a particular signal route on a board. As a result, it is becoming more difficult to establish tight matching requirements between the control signals for the DDR bus relative to the clock signals.

BRIEF DESCRIPTION OF THE DRAWINGS

Referring now to the drawings in which like reference numbers represent corresponding parts throughout.

DETAILED DESCRIPTION

In the following description, reference is made to the accompanying drawings which form a part hereof and which illustrate several embodiments. It is understood that other embodiments may be utilized and structural and operational changes may be made.

Embodiments relate to a method and an apparatus for the training of a control signal in a DDR based system. In certain embodiments of a DDR based system, a memory controller is coupled to a DDR DRAM device. The memory controller may communicate with the DDR DRAM device via signals, such as a control signal, a clock signal, command signals, etc. In certain embodiments, the memory controller that is coupled to a DDR DRAM device is operable to train the control signal with respect to the clock signal, by iteratively analyzing a strobe signal that is received by the memory controller from the DDR DRAM device. In certain embodiments, the DDR based system may include a DDR DIMM. Memory configurations that are not designed as a DIMM may be employed in alternative embodiments. In other embodiments, the control signal may be trained in a system that is not a DDR based system.

In DDR based systems the control signals are used to qualify when the command signal encoding should be latched by the memory device. Prior to any training of the command signal timings relative to the clock where the clock is generated by the memory controller and received by the memory device, and prior to any training of the data bus timings and voltages, it is important to establish stable control signal timings. In certain DDR based systems the control signal should be trained early, and there are no other signal timings that have been previously trained. It may be desirable to establish feedback that provides a pass or a fail response as the control signal timing is moved relative to the clock signal timing.

Previous approaches with DDR interfaces, where the command bus is qualified by the control signals, have included using relaxed command timings to ensure that the command to clock timing relationship is not the limiting factor. In these cases the control signals have been trained by sending read commands and interpreting whether or not the read command was received by the DIMM. Another method to solve the control signal training issue is to provide a loopback sampling capability in the DDR DIMM itself, such as with DDR4

Registered DIMMs. This requires use of the error feedback signal to indicate the sampled value within a register of the DDR DIMM. In this loopback mode, the register receives the command and control signals, samples the value at predetermined intervals, and then sends the sampled value back to the host memory controller. This approach requires the ability to send a periodic control signal from the memory controller, which may not be supported.

Figure 1:
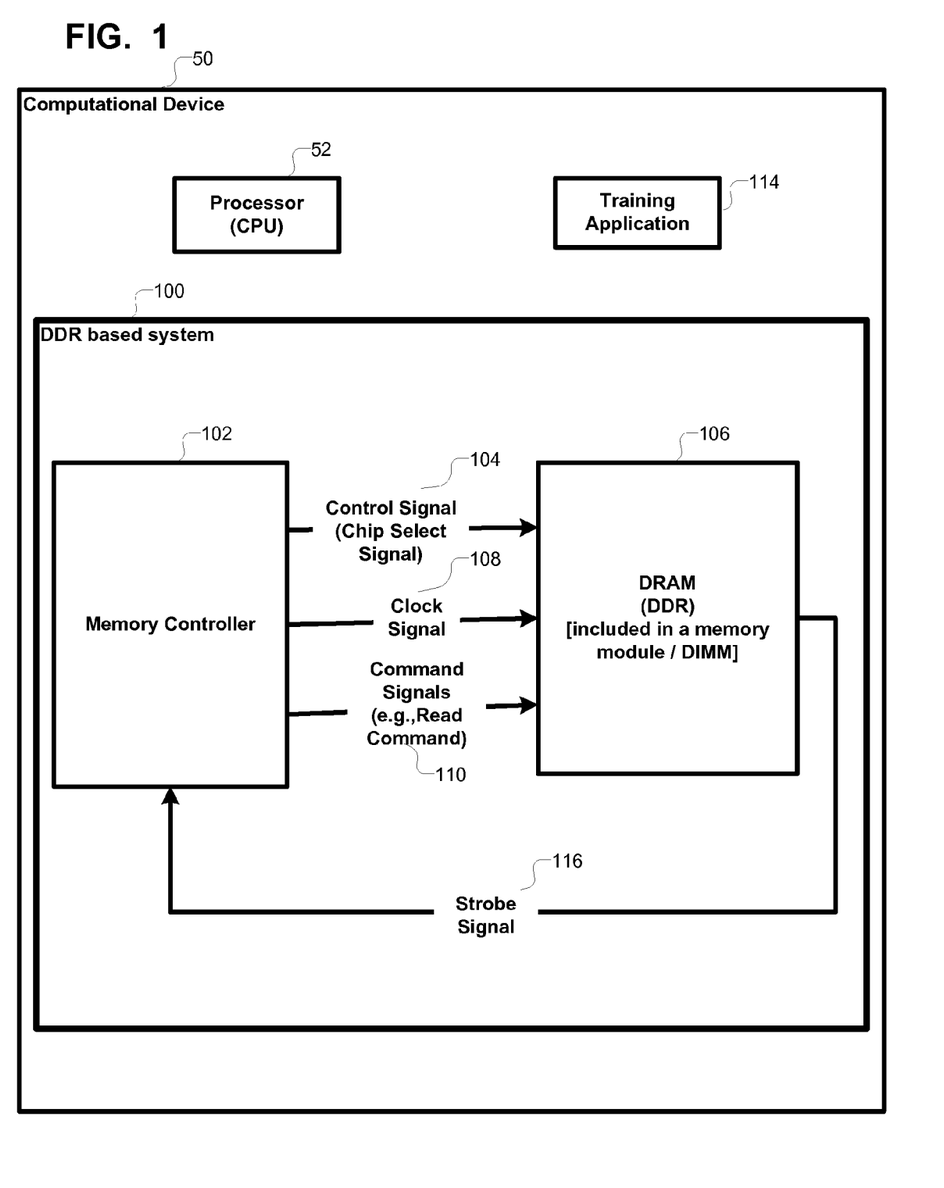
FIG. 1 illustrates a block diagram of a DDR based system implemented in a computational device, in accordance with certain embodiments.

FIG. 1 shows a computational device 50 comprising a processor 52 and a DDR based memory system 100. The computational device 50 may be any suitable device including those presently known in the art, such as, a personal computer, a workstation, a server, a mainframe, a hand held computer, a palm top computer, a telephony device, a network appliance, a blade computer, a storage server, etc.

The DDR based memory system 100 comprises a memory controller 102 operable to train a control signal 104 and a DRAM 106 coupled to the memory controller 102, according to one embodiment.

In one embodiment, the memory controller 102 is integrated within a microprocessor (CPU). In other embodiments, the memory controller 102 is a separate integrated circuit (IC) on the motherboard and is coupled to the processor 52 and the DRAM 106. The DRAM 106 may be included in a memory module or DIMM, where the memory module may include register devices, buffer devices, etc., in addition to the DRAM. In certain embodiments, the DRAM 106 comprises a DDR memory device, and in certain other embodiments the DRAM 106 comprises a non-DRAM memory device.

In one embodiment, the memory controller 102 communicates with the DRAM 106 via signals including, but not limited to, a control signal 104 (e.g. a chip select signal), a clock signal 108, command signals 110 (e.g., a read command), and any other signals to cause communication between the memory controller 102 and the DRAM 106. Note that in the corresponding drawings of the embodiments, signals are represented with lines. Some lines may have arrows at one or more ends, to indicate the primary information flow direction. Such indications are not intended to be limiting. Rather, the lines are used in connection with one or more exemplary embodiments to facilitate easier understanding of a circuit or a logical unit. Any represented signal, as dictated by design needs or preferences, may actually comprise one or more signals that may travel in either direction and may be implemented with any suitable type of signal scheme.

In one embodiment, a training application 114 executes in the computational device 50, where the training application 114 may be implemented in hardware, software, firmware or any combination thereof. The training application 114 allows the memory controller 102 to train the chip select signal 104 by interpreting a strobe signal 116 that is received from the DRAM 106 by the memory controller 102, in response to a read command 110 sent from the memory controller 102 to the DRAM 106.

Certain embodiments provide a method to determine the control signal edges relative to the clock signal, while not requiring any additional hardware support in the memory controller 102 or the DRAM 106. In certain embodiments, the control signal 104 may comprise a chip select signal whereas in other embodiments the control signal 104 may comprise a grant signal. Certain embodiments rely on the ability to sample the read return strobes after a read command is sent to the DRAM 106, to center the control signal 104 relative to a clock cycle of the clock signal 108.

Figure 2:
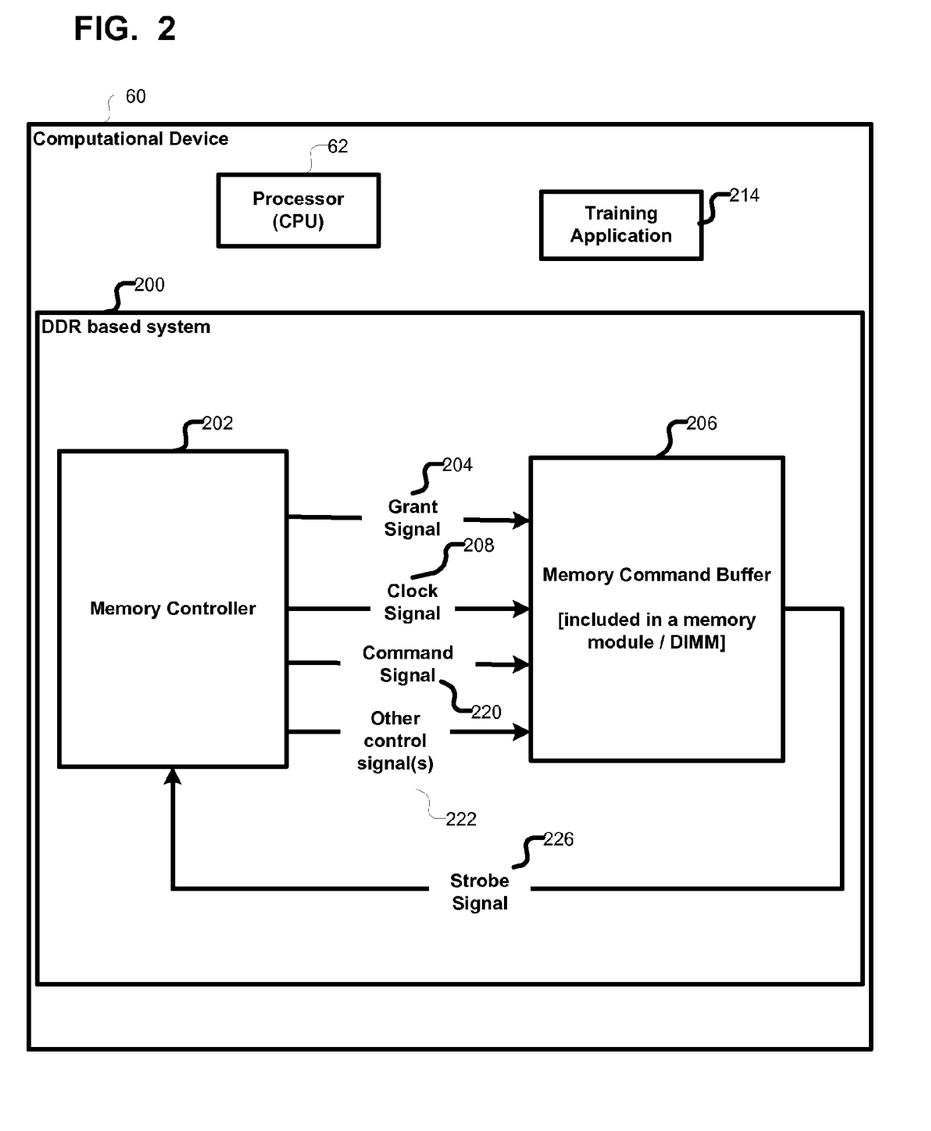
FIG. 2 illustrates another block diagram of a DDR based system implemented in a computational device, in accordance with certain embodiments.

FIG. 2 illustrates a block diagram of a memory system 200 implemented within a computational device 60 having a processor 62, in accordance with certain embodiments. In FIG. 2, the memory controller 202 transmits a grant signal 204 which is a type of control signal, a clock signal 208, a command signal 220 (e.g., a read command), and other control signals 222 to a memory control buffer 206. In certain embodiments, the memory controller 202 may receive a strobe signal 226 returned by the memory control buffer 206. A training application 214 executes in the computation device 60 to train the grant signal 204 of the DDR based system 200. In FIG. 2, the grant signal 204 does not qualify any command encoding and is a stand-alone signal that is to be aligned correctly with the clock signal 208. Such a stand-alone grant signal may be implemented in certain embodiments in addition or as an alternative to a chip select signal.

Figure 3:
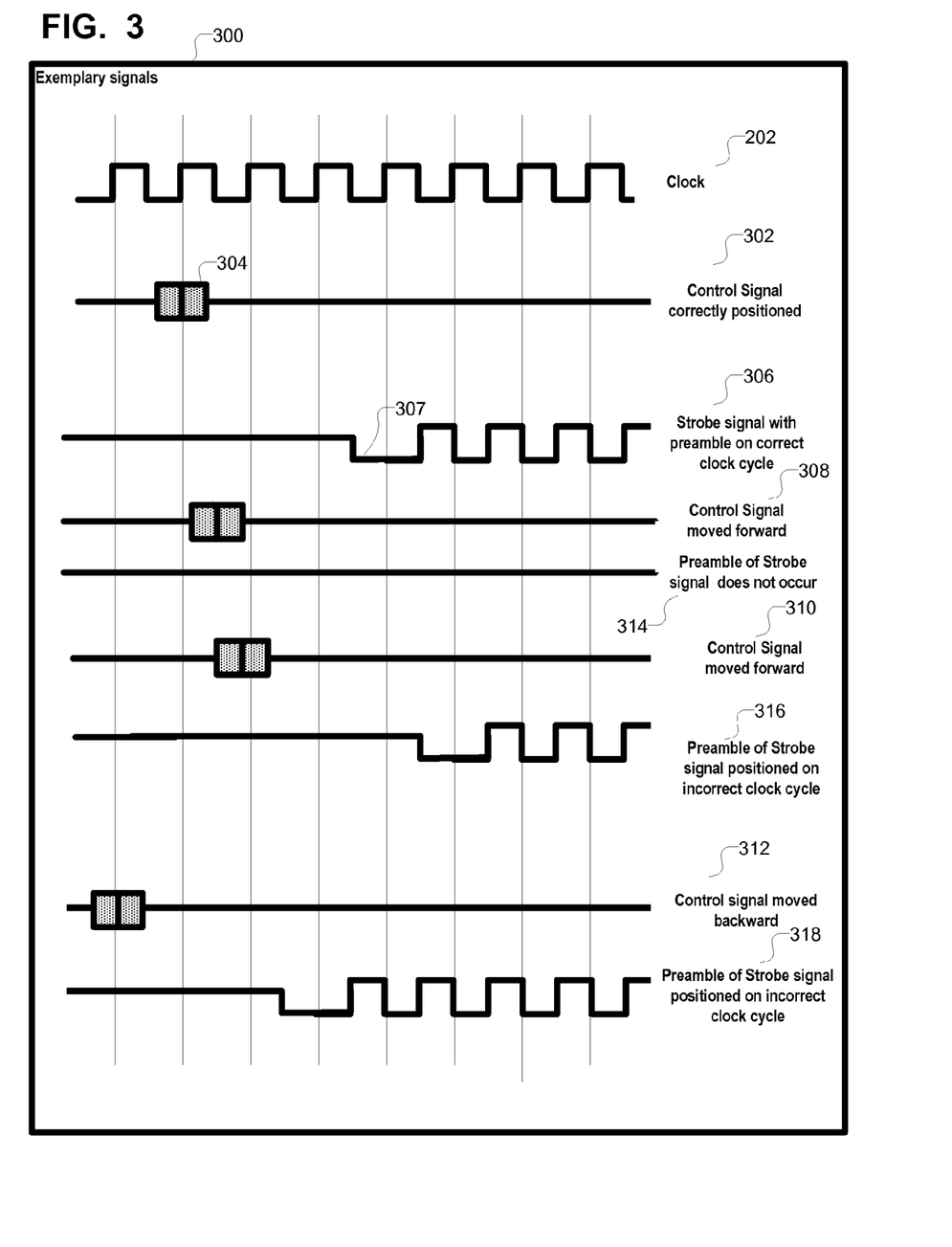
FIG. 3 illustrates a block diagram that shows exemplary signals, in accordance with certain embodiments.

FIG. 3 illustrates a block diagram 300 that shows exemplary signals, in accordance with certain embodiments. The exemplary signals shown are the clock signal 202, where the control signal is trained by the training application 114 to be correctly positioned with respect to the clock signal 202 as shown via reference numeral 302. The correct positioning of the control signal occurs when the center 304 of the control signal falls on the rising edge of a clock cycle, and the strobe signal's preamble 307 is positioned on the correct clock cycle (as shown via reference numeral 306).

In certain embodiments, the training application 114 determines the correct positioning of the control signal by moving the control signal forward and backward as shown via reference numerals 308, 310, 312. In certain embodiments, when the control signal is moved forward (reference numeral 308), the preamble 307 of the strobe signal may not occur (as shown via reference numeral 314). In certain embodiments, when the control signal is moved still more forward (reference numeral 310) or backward (reference numeral 312) the preamble of the control signal may occur but may be positioned on an incorrect clock cycle (as shown via reference numerals 316, 318).

Therefore FIG. 3 illustrates certain embodiments in which via iterative movements of the control signal backward and forward, the control signal is correctly positioned with respect to the clock signal, based on maintaining the correct positioning of the preamble of the strobe signal.

Figure 4:
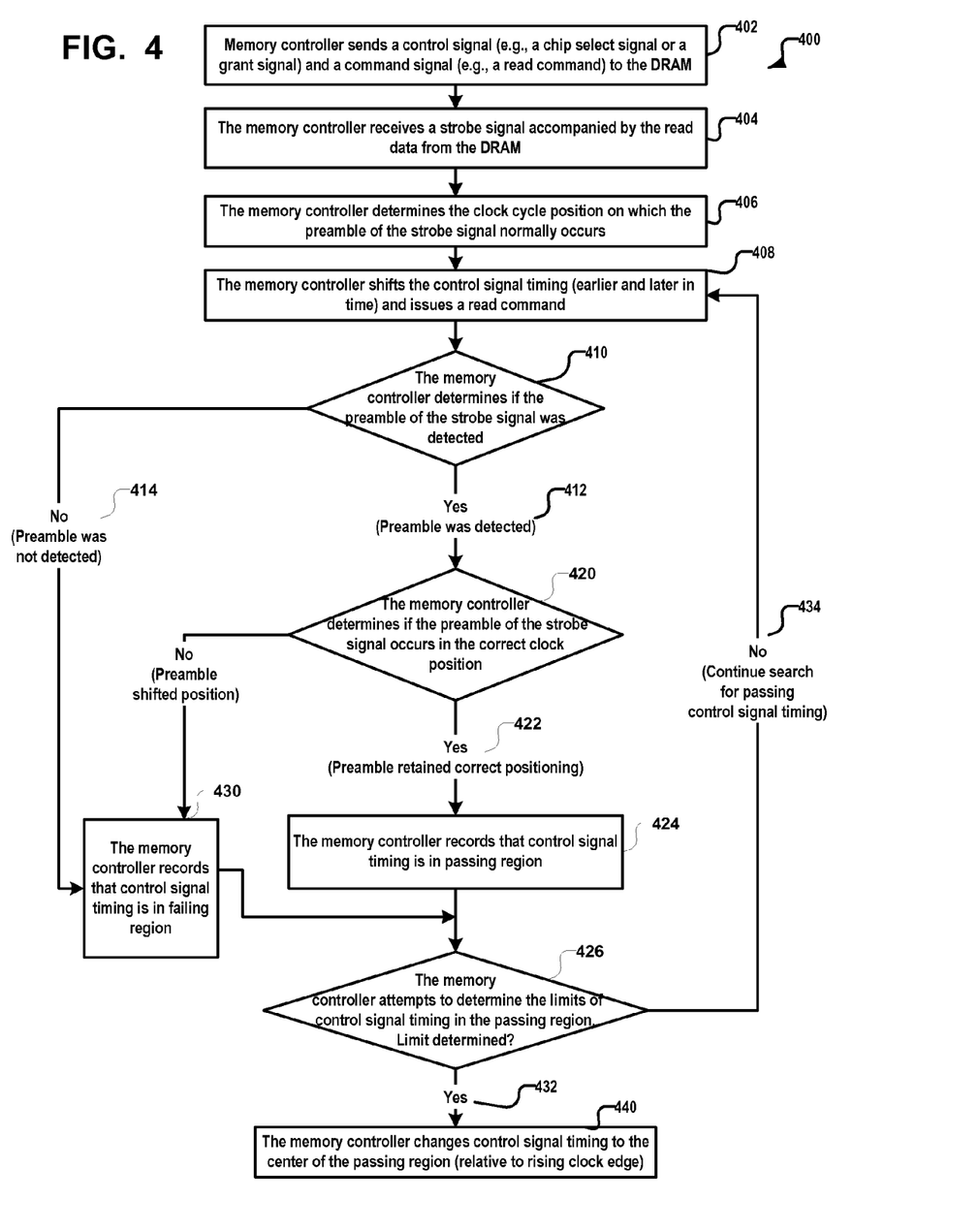
FIG. 4 illustrates a flowchart that shows first operations, in accordance with certain embodiments.

FIG. 4 illustrates a flowchart 400 that shows operations performed in the DDR based system 100, 200 in accordance with certain embodiments. The operations shown in FIG. 4 may be performed at least by the training applications 114, 214 executing in the computational devices 50, 60 which control the operations performed by the memory controllers 102, 202.

Control starts at block 402 where the memory controller 102 sends a control signal 104 (e.g., a chip select signal or a grant signal) and a command signal (e.g., a read command) to the DRAM 106. The memory controller 102 receives (at block 404) a strobe signal 116 accompanied by the read data from the DRAM 106.

Control proceeds to block 406, in which the memory controller 102 determines the clock cycle position on which the preamble of the strobe signal normally occurs. The memory controller 102 shifts (at block 408) the control signal timing (earlier and later in time) and issues a read command.

Control proceeds to block 410 in which the memory controller 102 determines if the preamble of the strobe signal 116 was detected. If so (reference numeral 412), the memory controller 102 determines (at block 420) if the preamble of the strobe signal 116 occurs in the correct clock position. If not (reference numeral 414) then the preamble was not detected and control proceeds to block 430.

If at block 420, a determination is made that the preamble of the strobe signal occurs in the correct clock position then the preamble has retained correct positioning and control proceeds (reference numeral 422) to block 424. At block 424, the memory controller 102 records that the control signal timing is in the passing region. Control proceeds to block 426 where the memory controller 102 attempts to determine the limits of the control signal timing in the passing region and if the limit has not been determined (reference numeral 434) the memory controller 102 attempts to determine the limits of the control signal timing in the passing region by returning control to block 408.

If at block 426, the limit of the control signal timing in the passing region is determined then control proceeds (reference numeral 432) to block 440 in which the memory controller 102 changes the control signal timing to the center of the passing region relative to a rising clock edge.

If at block 420, it is determined that the preamble of the strobe signal does not occur in the correct clock position then the preamble has shifted position and control proceeds to block 430. At block 430, the memory controller 102 records that the control signal timing is in a failing region and control proceeds to block 426.

Block 426 in which the memory controller determines the limits of control signal timings in the passing region is intended to abstract the details of the search algorithm to find the limits of the control signal timing in the passing region. There are a plurality of methods known in the art to search for the passing region. Those methods may include:
1) Starting in passing region and searching from inside-out (both left and right directions) to find edges where a first failure occurs; and
2) Starting in failing region (on the left side) and searching in one direction (left to right) to determine fail-to-pass transition, then pass-to-fail transition.

Once the limits of the passing region are known, then the memory controller 102 can program the control signal timing in the center of the passing region (to provide optimal control signal setup and hold times relative to the rising clock edge).

Certain embodiments provide a method by which the memory controller determines if the control signal timing is located in the passing region (using a strobe or alternatively an error signal feedback mechanism). Any possible search method to find the limits of the passing region may be implemented in certain embodiments.

Therefore, FIG. 4 illustrates certain embodiments in which the training application 114 programs the control signal timing in the center of the largest passing region relative to a rising clock edge.

Figure 5:
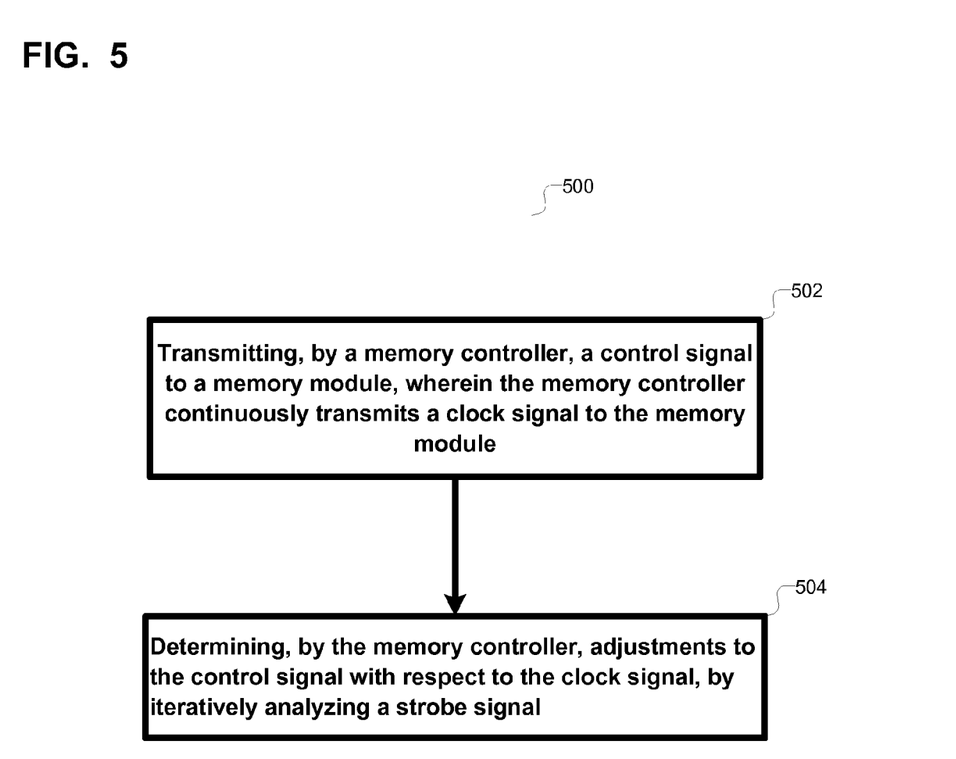
FIG. 5 illustrates a flowchart that shows second operations, in accordance with certain embodiments.

FIG. 5 illustrates certain operations 500, in accordance with certain embodiments. The operations shown in FIG. 5 are for determining the correct positioning of the control signal and is performed by the memory controller 102, 104 under the control of the training application 114, 214.

Control starts at block 502 in which a memory controller 102 transmits a control signal to a memory module 106, where the memory controller 102 continuously transmits a clock signal 108 to the memory module 106. The memory controller 102 determines (at block 504) adjustments to the control signal 104 with respect to the clock signal 108, by iteratively analyzing a strobe signal 116.

Therefore, FIGS. 1-5 illustrate certain embodiments for training of the control signal of a DDR memory by iteratively analyzing a strobe signal.

The described operations may be implemented as a method, apparatus or computer program product using standard programming and/or engineering techniques to produce software, firmware, hardware, or any combination thereof. The described operations may be implemented as code maintained in a "computer readable storage medium", where a processor may read and execute the code from the computer storage readable medium. The computer readable storage medium includes at least one of electronic circuitry, storage materials, inorganic materials, organic materials, biological materials, a casing, a housing, a coating, and hardware. A computer readable storage medium may comprise, but is not limited to, a magnetic storage medium (e.g., hard disk drives, floppy disks, tape, etc.), optical storage (CD-ROMs, DVDs, optical disks, etc.), volatile and non-volatile memory devices (e.g., EEPROMs, ROMs, PROMs, RAMs, DRAMs, SRAMs. Flash Memory, firmware, programmable logic, etc.), Solid State Devices (SSD), etc. The code implementing the described operations may further be implemented in hardware logic implemented in a hardware device (e.g., an integrated circuit chip, Programmable Gate Array (PGA), Application Specific Integrated Circuit (ASIC), etc.). Still further, the code implementing the described operations may be implemented in "transmission signals", where transmission signals may propagate through space or through a transmission media, such as an optical fiber, copper wire, etc. The transmission signals in which the code or logic is encoded may further comprise a wireless signal, satellite transmission, radio waves, infrared signals, Bluetooth, etc. The program code embedded on a computer readable storage medium may be transmitted as transmission signals from a transmitting station or computer to a receiving station or computer. A computer readable storage medium is not comprised solely of transmission signals. Those skilled in the art will recognize that many modifications may be made to this configuration, and that the article of manufacture may comprise suitable information bearing medium known in the art.

Computer program code for carrying out operations for aspects of the certain embodiments may be written in any combination of one or more programming languages. Blocks of the flowchart and block diagrams may be implemented by computer program instructions.

Figure 6:
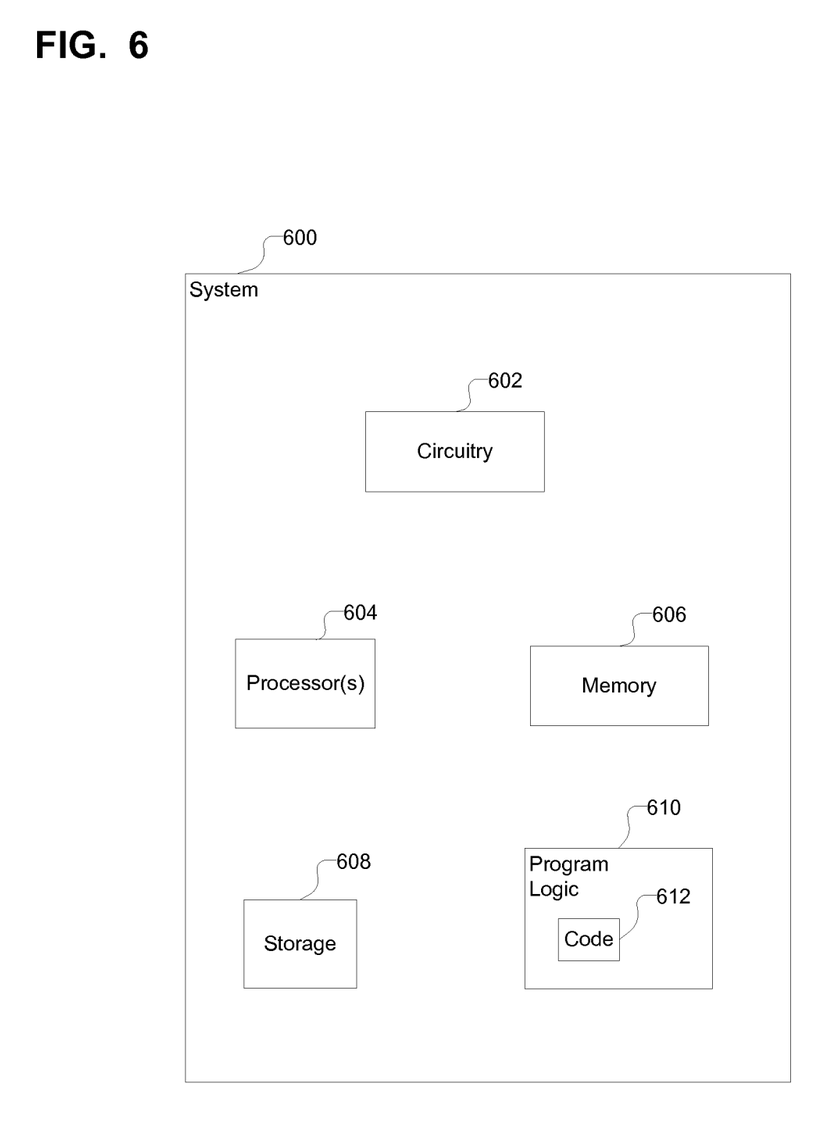
FIG. 6 illustrates a block diagram of computational device, in accordance with certain embodiments.

FIG. 6 illustrates a block diagram of a system 600 that corresponds to the computational devices 50, 60, in accordance with certain embodiments. The system 600 may include a circuitry 602 that may in certain embodiments include at least a processor 604. The system 600 may also include a memory 606 (e.g., a volatile memory device), and storage 608. The storage 608 may include a non-volatile memory device (e.g., EEPROM, ROM, PROM, RAM, DRAM, SRAM, flash, firmware, programmable logic, etc.), magnetic disk drive, optical disk drive, tape drive, etc. The storage 608 may comprise an internal storage device, an attached storage device and/or a network accessible storage device. The system 600 may include a program logic 610 including code 612 that may be loaded into the memory 606 and executed by the processor 604 or circuitry 602. In certain embodiments, the program logic 610 including code 612 may be stored in the storage 608. In certain other embodiments, the program logic 610 may be implemented in the circuitry 602. Therefore, while FIG. 6 shows the program logic 610 separately from the other elements, the program logic 610 may be implemented in the memory 606 and/or the circuitry 602.

Certain embodiments may be directed to a method for deploying computing instruction by a person or automated processing integrating computer-readable code into a computing system, wherein the code in combination with the computing system is enabled to perform the operations of the described embodiments.

The terms "an embodiment", "embodiment", "embodiments", "the embodiment", "the embodiments", "one or more embodiments", "some embodiments", and "one embodiment" mean "one or more (but not all) embodiments" unless expressly specified otherwise.

The terms "including", "comprising", "having" and variations thereof mean "including but not limited to", unless expressly specified otherwise.

The enumerated listing of items does not imply that any or all of the items are mutually exclusive, unless expressly specified otherwise.

The terms "a", "an" and "the" mean "one or more", unless expressly specified otherwise.

Devices that are in communication with each other need not be in continuous communication with each other, unless expressly specified otherwise. In addition, devices that are in communication with each other may communicate directly or indirectly through one or more intermediaries.

A description of an embodiment with several components in communication with each other does not imply that all such components are required. On the contrary a variety of optional components are described to illustrate the wide variety of possible embodiments.

Further, although process steps, method steps, algorithms or the like may be described in a sequential order, such processes, methods and algorithms may be configured to work in alternate orders. In other words, any sequence or order of steps that may be described does not necessarily indicate a requirement that the steps be performed in that order. The steps of processes described herein may be performed in any order practical. Further, some steps may be performed simultaneously.

When a single device or article is described herein, it will be readily apparent that more than one device/article (whether or not they cooperate) may be used in place of a single device/article. Similarly, where more than one device or article is described herein (whether or not they cooperate), it will be readily apparent that a single device/article may be used in place of the more than one device or article or a different number of devices/articles may be used instead of the shown number of devices or programs. The functionality and/or the features of a device may be alternatively embodied by one or more other devices which are not explicitly described as having such functionality/features. Thus, other embodiments need not include the device itself.

At least certain operations that may have been illustrated in the figures show certain events occurring in a certain order. In alternative embodiments, certain operations may be performed in a different order, modified or removed. Moreover, steps may be added to the above described logic and still conform to the described embodiments.

Further, operations described herein may occur sequentially or certain operations may be processed in parallel. Yet further, operations may be performed by a single processing unit or by distributed processing units.

The foregoing description of various embodiments has been presented for the purposes of illustration and description. It is not intended to be exhaustive or to be limited to the precise forms disclosed. Many modifications and variations are possible in light of the above teaching.

The following examples relate to certain embodiments.

Example 1 is a method for signal adjustment in which a memory controller transmits a control signal to a memory module, wherein the memory controller continuously transmits a clock signal to the memory module. The memory controller determines adjustments to the control signal with respect to the clock signal, by iteratively analyzing a strobe signal.

In example 2, the subject matter of example 1 may include that the determining of the adjustments to the control signal further comprises shifting a timing of the control signal earlier and later in time with respect to the clock signal to center a timing of the control signal relative to a rising edge of the clock signal while ensuring that a preamble of the strobe signal retains correct positioning.

In example 3, the subject matter of example 2 may include that the timing of the control signal is centered, subsequent to determining iteratively a largest passing region of the timing of the control signal.

In example 4, the subject matter of example 2 may include that the memory controller sends a read command to the memory module. The memory controller receives the strobe signal accompanied by read data from the memory module, in response to the sending of the read command. The memory controller determines a clock cycle position in which the preamble of the strobe signal normally occurs.

In example 5, the subject matter of example 4 may include that the memory controller issues another read command, subsequent to an adjustment to the control signal, and then determines if the preamble of the strobe signal is detected.

In example 6, the subject matter of example 5 may include that in response to determining that the strobe signal is detected, a determination is made if the preamble of the strobe signal occurs in a correct clock cycle position. In response to determining that the preamble of the strobe signal does occur in the correct clock position, the timing of the control signal is programmed in a center of a largest passing region relative to a rising clock edge, if a largest passing region of the timing of the control signal timing has been determined.

In example 7, the subject matter of example 5 may include that in response to determining that the strobe signal is not detected, a recording is made that the control signal timing is in a failing region.

In example 8, the subject matter of example 2 may include that the memory module comprises a DDR memory, and the control signal comprises a chip select signal or a grant signal.

In example 9, the subject matter of example 2 may include that the memory module comprises a non-DDR memory, and the control signal comprises a chip select signal or a grant signal.

In example 10, the subject matter of example 1 may include that the memory controller determines if a timing of the control signal is in a center of a passing region.

Example 11 is a system in which a memory controller is coupled to a memory module, and the memory controller is operable to transmit a control signal to a memory module, wherein the memory controller continuously transmits a clock signal to the memory module. The memory controller is operable to determine adjustments to the control signal with respect to the clock signal, by iteratively analyzing a strobe signal.

In example 12, the subject matter of example 11 may include that the determining of the adjustments to the control signal further comprises shifting a timing of the control signal earlier and later in time with respect to the clock signal to center a timing of the control signal relative to a rising edge of the clock signal while ensuring that a preamble of the strobe signal retains correct positioning.

In example 13, the subject matter of example 12 may include that the timing of the control signal is centered, subsequent to determining iteratively a largest passing region of the timing of the control signal.

In example 14, the subject matter of example 12 may include that the memory controller sends a read command to the memory module. The memory controller receives the strobe signal accompanied by read data from the memory module, in response to the sending of the read command. The memory controller determines a clock cycle position in which the preamble of the strobe signal normally occurs.

In example 15, the subject matter of example 14 may include that the memory controller issues another read command, subsequent to an adjustment to the control signal, and then determines if the preamble of the strobe signal is detected.

In example 16, the subject matter of example 15 may include that in response to determining that the strobe signal is detected, a determination is made if the preamble of the strobe signal occurs in a correct clock cycle position. In response to determining that the preamble of the strobe signal does occur in the correct clock position, the timing of the control signal is programmed in a center of a largest passing region relative to a rising clock edge, if a largest passing region of the timing of the control signal timing has been determined.

In example 17, the subject matter of example 15 may include that in response to determining that the strobe signal is not detected, a recording is made that the control signal timing is in a failing region.

In example 18, the subject matter of example 12 may include that the memory module comprises a DDR memory, and the control signal comprises a chip select signal or a grant signal.

In example 19, the subject matter of example 12 may include that the memory module comprises a non-DDR memory, and the control signal comprises a chip select signal or a grant signal.

In example 20, the subject matter of example 11 may include that the memory controller determines if a timing of the control signal is in a center of a passing region.

Example 21 is a computational system for signal adjustment comprising a memory module, and a memory controller coupled to the memory module. A processor is coupled to the memory controller, and the processor is operable to transmit a control signal to a memory module, wherein the memory controller continuously transmits a clock signal to the memory module. The memory controller is operable to determine adjustments to the control signal with respect to the clock signal, by iteratively analyzing a strobe signal.

In example 22, the subject matter of example 21 may include that the determining of the adjustments to the control signal further comprises shifting a timing of the control signal earlier and later in time with respect to the clock signal to center a timing of the control signal relative to a rising edge of the clock signal while ensuring that a preamble of the strobe signal retains correct positioning.

In example 23, the subject matter of example 22 may include that the timing of the control signal is centered, subsequent to determining iteratively a largest passing region of the timing of the control signal.

Example 24 is a system for signal adjustment comprising a memory module, and a memory controller coupled to the memory module, where the memory controller is operable to transmit a control signal to a memory module, where the memory controller continuously transmits a clock signal to the memory module. The memory controller is operable to determine adjustments to the control signal with respect to the clock signal, by iteratively analyzing a strobe signal.

In example 25, the subject matter of example 24 may include that the determining of the adjustments to the control signal further comprises shifting a timing of the control signal earlier and later in time with respect to the clock signal to center a timing of the control signal relative to a rising edge of the clock signal while ensuring that a preamble of the strobe signal retains correct positioning.

Example 26 is a system for signal adjustment comprising means for transmitting a control signal to a memory module, where the memory controller continuously transmits a clock signal to the memory module. Further included are means for the memory controller to determine adjustments to the control signal with respect to the clock signal, by iteratively analyzing a strobe signal.

In example 27, the subject matter of example 26 may include that the determining of the adjustments to the control signal further comprises means for shifting a timing of the control signal earlier and later in time with respect to the clock signal to center a timing of the control signal relative to a rising edge of the clock signal while ensuring that a preamble of the strobe signal retains correct positioning.

In example 28, the subject matter of example 26 may include that the timing of the control signal is centered, subsequent to determining iteratively a largest passing region of the timing of the control signal.

In example 29, the subject matter of example 2 may include means for the memory controller to send a read command to the memory module. Also included are means for the memory controller to receive the strobe signal accompanied by read data from the memory module, in response to the sending of the read command. Further included are means for the memory controller to determine a clock cycle position in which the preamble of the strobe signal normally occurs.

In example 30, the subject matter of example 29 may include that the memory controller issues another read command, subsequent to an adjustment to the control signal, and then determines if the preamble of the strobe signal is detected.

In example 31, the subject matter of example 30 may include means for determining if the preamble of the strobe signal occurs in a correct clock cycle position, in response to determining that the strobe signal is detected, and means for programming the timing of the control signal in a center of a largest passing region relative to a rising clock edge, in response to determining that the preamble of the strobe signal does occur in the correct clock position, if a largest passing region of the timing of the control signal timing has been determined.

In example 32, the subject matter of example 30 may include means for recording that the control signal timing is in a failing region in response to determining that the strobe signal is not detected.

In example 33, the subject matter of example 27 may include that the memory module comprises a DDR memory, and the control signal comprises a chip select signal or a grant signal.

In example 34, the subject matter of example 27 may include that the memory module comprises a non-DDR memory, and the control signal comprises a chip select signal or a grant signal.

In example 35, the subject matter of example 26 may include that the memory controller determines if a timing of the control signal is in a center of a passing region.

Example 36 is computer readable storage medium, wherein code stored in the computer readable storage medium causes a processor to perform operations comprising transmitting, by a memory controller, a control signal to a memory module, wherein the memory controller continuously transmits a clock signal to the memory module, and determining, by the memory controller, adjustments to the control signal with respect to the clock signal, by iteratively analyzing a strobe signal In example 37, the subject matter of example 36 may include that the determining of the adjustments to the control signal further comprises shifting a timing of the control signal earlier and later in time with respect to the clock signal to center a timing of the control signal relative to a rising edge of the clock signal while ensuring that a preamble of the strobe signal retains correct positioning.

In example 38, the subject matter of example 37 may include that the timing of the control signal is centered, subsequent to determining iteratively a largest passing region of the timing of the control signal.

In example 39, the subject matter of example 37 may include that the memory controller sends a read command to the memory module. The memory controller receives the strobe signal accompanied by read data from the memory module, in response to the sending of the read command. The memory controller determines a clock cycle position in which the preamble of the strobe signal normally occurs.

In example 40, the subject matter of example 39 may include that the memory controller issues another read command, subsequent to an adjustment to the control signal, and then determines if the preamble of the strobe signal is detected.

In example 41, the subject matter of example 40 may include that in response to determining that the strobe signal is detected, a determination is made if the preamble of the strobe signal occurs in a correct clock cycle position. In response to determining that the preamble of the strobe signal does occur in the correct clock position, the timing of the control signal is programmed in a center of a largest passing region relative to a rising clock edge, if a largest passing region of the timing of the control signal timing has been determined.

In example 42, the subject matter of example 37 may include that in response to determining that the strobe signal is not detected, a recording is made that the control signal timing is in a failing region.

In example 43, the subject matter of example 37 may include that the memory module comprises a DDR memory, and the control signal comprises a chip select signal or a grant signal.

In example 44, the subject matter of example 37 may include that the memory module comprises a non-DDR memory, and the control signal comprises a chip select signal or a grant signal.

In example 45, the subject matter of example 37 may include that the memory controller determines if a timing of the control signal is in a center of a passing region.

Example 46 comprises a computer readable storage medium, where code stored in the computer readable storage medium causes a processor to perform the method of any one of the claims 1, 2, 3, 4, 5, 6, 7, 8, 9, 1

What is claimed is:

1. A method for signal adjustment, the method comprising:
   transmitting, by a memory controller, a control signal to a memory module, wherein the memory controller continuously transmits a clock signal to the memory module; and
   determining, by the memory controller, adjustments to the control signal with respect to the clock signal, by iteratively analyzing a strobe signal.

2. The method of claim 1, wherein the determining of the adjustments to the control signal further comprises:
   shifting a timing of the control signal earlier and later in time with respect to the clock signal to center a timing of the control signal relative to a rising edge of the clock signal while ensuring that a preamble of the strobe signal retains correct positioning.

3. The method of claim 2, wherein the timing of the control signal is centered, subsequent to determining iteratively a largest passing region of the timing of the control signal.

4. The method of claim 2, the method further comprising:
   sending, by the memory controller, a read command to the memory module;
   receiving, by the memory controller, the strobe signal accompanied by read data from the memory module, in response to the sending of the read command; and
   determining, by the memory controller, a clock cycle position in which the preamble of the strobe signal normally occurs.

5. The method of claim 4, wherein the memory controller issues another read command, subsequent to an adjustment to the control signal, and then determines if the preamble of the strobe signal is detected.

6. The method of claim 5, the method further comprising:
   in response to determining that the strobe signal is detected, determining if the preamble of the strobe signal occurs in a correct clock cycle position; and
   in response to determining that the preamble of the strobe signal does occur in the correct clock position, programming the timing of the control signal in a center of a largest passing region relative to a rising clock edge, if a largest passing region of the timing of the control signal timing has been determined.

7. The method of claim 5, the method further comprising:
   in response to determining that the strobe signal is not detected, recording that the control signal timing is in a failing region.

8. The method of claim 2, wherein:
   the memory module comprises a DDR memory; and
   the control signal comprises a chip select signal or a grant signal.

9. The method of claim 2, wherein:
   the memory module comprises a non-DDR memory; and
   the control signal comprises a chip select signal or a grant signal.

10. The method of claim 1, wherein the memory controller determines if a timing of the control signal is in a center of a passing region.

11. A memory controller coupled to a memory module, wherein the memory controller is operable to:
    transmit a control signal to the memory module, wherein the memory controller continuously transmits a clock signal to the memory module; and
    determine adjustments to the control signal with respect to the clock signal, by iteratively analyzing a strobe signal.

12. The memory controller of claim 11, wherein determining of the adjustments to the control signal further comprises:
    shifting a timing of the control signal earlier and later in time with respect to the clock signal to center a timing of the control signal relative to a rising edge of the clock signal while ensuring that a preamble of the strobe signal retains correct positioning.

13. The memory controller of claim 12, wherein the timing of the control signal is centered, subsequent to determining iteratively a largest passing region of the timing of the control signal.

14. The memory controller of claim 12, wherein the memory controller is further operable to:

send a read command to the memory module;
receive the strobe signal accompanied by read data from the memory module, in response to the sending of the read command; and
determine a clock cycle position of which the preamble of the strobe signal normally occurs.

15. The memory controller of claim 14, wherein the memory controller issues another read command, subsequent to an adjustment to the control signal, and then determines if the preamble of the strobe signal is detected.

16. The memory controller of claim 15, wherein the memory controller is further operable to:
determine if the preamble of the strobe signal occurs in a correct clock cycle position, in response to determining that the strobe signal is detected; and
program the timing of the control signal in a center of a largest passing region relative to a rising clock edge, if a largest passing region of the timing of the control signal timing has been determined, in response to determining that the preamble of the strobe signal does occur in the correct clock position.

17. The memory controller of claim 15, wherein the memory controller is further operable to:
record that the control signal timing is in a failing region, in response to determining that the strobe signal is not detected.

18. The memory controller of claim 12, wherein:
the memory module to which the memory controller is coupled comprises a DDR memory; and
the control signal comprises a chip select signal or a grant signal.

19. The memory controller of claim 12, wherein:
the memory module to which the memory controller is coupled comprises a non-DDR memory; and
the control signal comprises a chip select signal or a grant signal.

20. The memory controller of claim 11, wherein the memory controller determines if a timing of the control signal is in a center of a passing region.

21. A computational system for signal adjustment, the computational system comprising:
a memory module;
a memory controller coupled to the memory module;
a processor coupled to the memory controller, wherein the processor is operable to:
transmit a control signal to a memory module, wherein the memory controller continuously transmits a clock signal to the memory module; and
determine adjustments to the control signal with respect to the clock signal, by iteratively analyzing a strobe signal.

22. The computational system of claim 21, wherein determining of the adjustments to the control signal further comprises:
shifting a timing of the control signal earlier and later in time with respect to the clock signal to center a timing of the control signal relative to a rising edge of the clock signal while ensuring that a preamble of the strobe signal retains correct positioning.

23. The computational system of claim 21, wherein the timing of the control signal is centered, subsequent to determining iteratively a largest passing region of the timing of the control signal.

24. A system for signal adjustment, the system comprising:
a memory module; and
a memory controller coupled to a memory module, where the memory controller is operable to:
transmit a control signal to a memory module, wherein the memory controller continuously transmits a clock signal to the memory module; and
determine adjustments to the control signal with respect to the clock signal, by iteratively analyzing a strobe signal.

25. The system of claim 24, wherein determining of the adjustments to the control signal further comprises:
shifting a timing of the control signal earlier and later in time with respect to the clock signal to center a timing of the control signal relative to a rising edge of the clock signal while ensuring that a preamble of the strobe signal retains correct positioning.

* * * * *